United States Patent
Neuhaus et al.

(10) Patent No.: US 8,551,883 B2
(45) Date of Patent: Oct. 8, 2013

(54) MASKING METHOD

(75) Inventors: Holger Neuhaus, Freiberg (DE); Andreas Krause, Radebeul (DE); Bernd Bitnar, Freiberg (DE); Frederick Bamberg, Freiberg (DE); Reinhold Schlosser, München (DE)

(73) Assignee: SolarWorld Innovations GmbH, Freiberg/Sachsen (DE)

( * ) Notice: Subject to any disclaimer, the term of this patent is extended or adjusted under 35 U.S.C. 154(b) by 357 days.

(21) Appl. No.: 12/815,598

(22) Filed: Jun. 15, 2010

(65) Prior Publication Data
US 2010/0317192 A1   Dec. 16, 2010

(30) Foreign Application Priority Data
Jun. 16, 2009 (DE) .................... 10 2009 024 982

(51) Int. Cl.
*H01L 21/308* (2006.01)

(52) U.S. Cl.
USPC ............. 438/674; 438/736; 257/E21.232

(58) Field of Classification Search
USPC ................ 438/736, 674; 257/E21.232
See application file for complete search history.

(56) References Cited

U.S. PATENT DOCUMENTS 6,475,555 B2 * 11/2002 Casey et al. ............... 427/98.5
6,528,145 B1 * 3/2003 Berger et al. .............. 428/156

FOREIGN PATENT DOCUMENTS

| CN | 101423682 A | 5/2009 |
| DE | 102007038744 | 2/2009 |
| EP | 2 056 352 A2 | 5/2009 |
| JP | 11340129 | 12/1999 |

OTHER PUBLICATIONS

U.S. Appl. No. 12/673,244, filed Feb. 12, 2010, Bitnar et al.

* cited by examiner

*Primary Examiner* — Zandra Smith
*Assistant Examiner* — Toniae Thomas
(74) *Attorney, Agent, or Firm* — McGlew and Tuttle, P.C.

(57) ABSTRACT

The invention relates to a method for masking a semiconductor substrate including the following steps: providing a planar semiconductor substrate having a first side and a second side lying opposite thereto, applying a mask to at least one of the sides, an extrusion printing method being used for applying the mask.

3 Claims, 3 Drawing Sheets

MASKING METHOD

FIELD OF THE INVENTION

The invention relates to a method for masking a semiconductor substrate. The also invention relates to a method for manufacturing a contact structure for a semiconductor component and an intermediate product during the manufacture of a semiconductor component.

BACKGROUND OF THE INVENTION

Masking processes are regularly used in semiconductor technology for manufacturing small structures. During this, masks are used that cover a semiconductor substrate and only exhibit openings at predetermined locations. Such masks serve to protect the semiconductor substrates during further processing. However, the manufacture of masks having structure sizes in the range of less than 100 µm is elaborate and expensive. Moreover, the edges of the mask smear as long as the mask material has not fully dried. This makes the manufacture of very small, precise structures more difficult. To avoid the problem of smearing, photolithographic methods are used in part. This involves a photoresist, which is first applied across the surface of the semiconductor substrate and then dried. Next, the desired structure is produced by exposure of a photomask and subsequent development. However, such methods are very time-consuming and expensive.

SUMMARY OF THE INVENTION

The invention is therefore based on the object of improving a masking method for manufacturing small structures. The invention is also based on the object of creating a method for manufacturing a contact structure having a small structure size.

These objects are achieved by a method for masking a semiconductor substrate comprising the steps of providing a planar semiconductor substrate having a first side and a second side lying opposite thereto, applying a mask to at least one of the sides, and an extrusion printing method being envisaged for applying the mask. These objects are further achieved by a use of the method for manufacturing a doping mask. Furthermore, these objects are achieved by an intermediate product during the manufacture of a semiconductor component, comprising a semiconductor substrate of a planar design having a first side and a second side lying opposite thereto, a mask on at least one of the sides, and the mask exhibiting at least two adjacent areas with different mask materials. The core of the invention consists in using an extrusion printing method for applying the mask.

During the application, the mask preferably exhibits a high viscosity. It is especially envisaged to fill the structures to be opened with a sacrificial material during the printing. This way, the structures are prevented from running apart, even though the mask materials are viscous during the printing. The mask thus advantageously comprises at least two different mask materials, which exhibit a mixability that is at best negligible.

The different mask materials are applied to the semiconductor substrate in a single step. The extrusion printing method is advantageously a co-extrusion printing method.

On the one hand, organic materials, which solidify during heating to a process temperature, and on the other hand, sacrificial materials, which evaporate during heating to a process temperature, are preferably envisaged as mask materials.

An etching paste, which etches the semiconductor substrate lying underneath in predetermined areas during heating to the process temperature, can also be envisaged as a sacrificial material. Correspondingly, selective doping of the semiconductor substrate can also be achieved by means of the 2-component mask.

The method serves in particular to manufacture a doping mask.

Moreover, the manufacture of a contact structure is possible in an easy way by means of the masking method according to the invention. Features and details of the invention result from the description of several embodiments based on the drawings.

DESCRIPTION OF THE PREFERRED EMBODIMENTS

Figure 1:
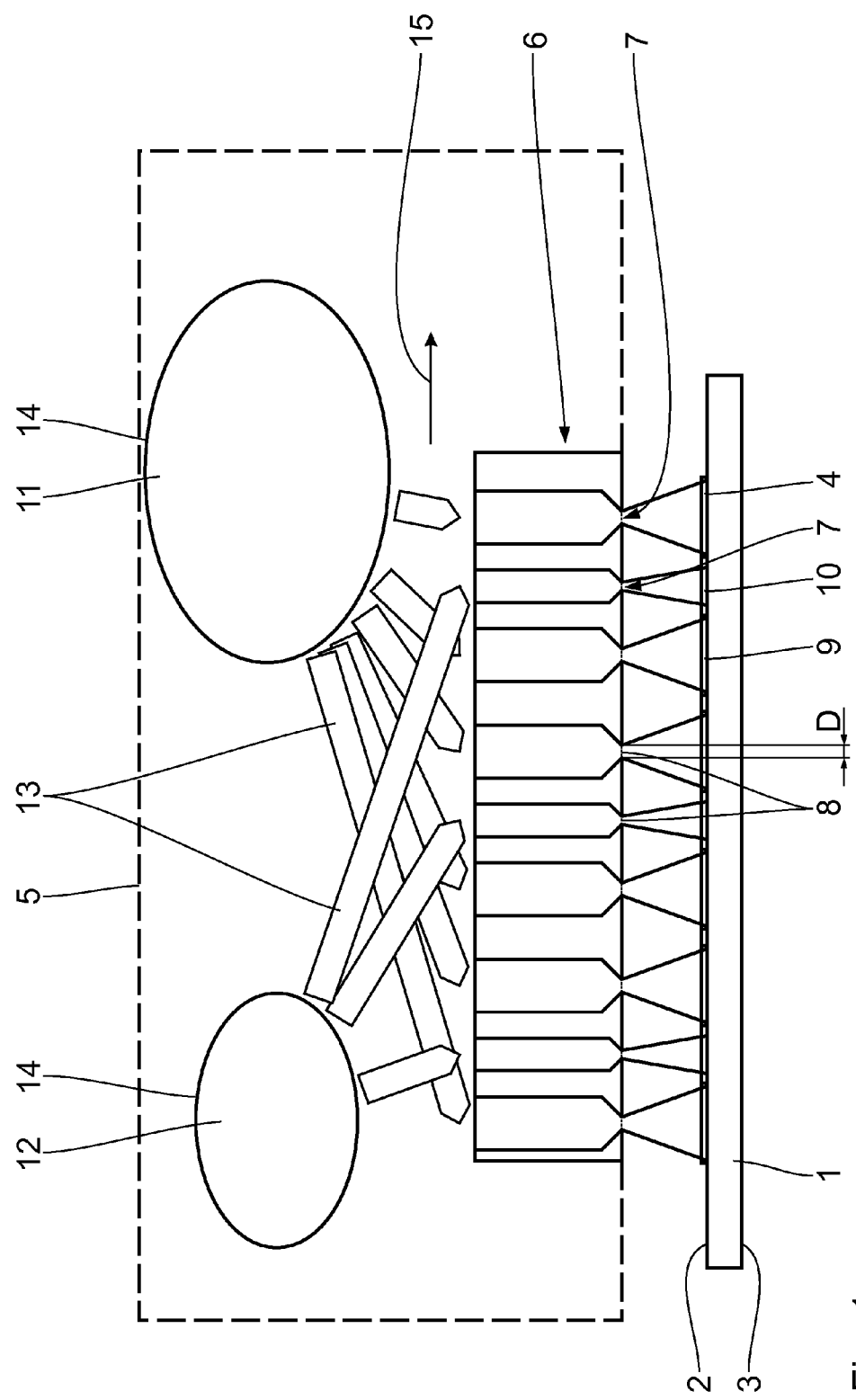
FIG. 1 shows a schematic representation of a first embodiment of the invention.
Figure 2:
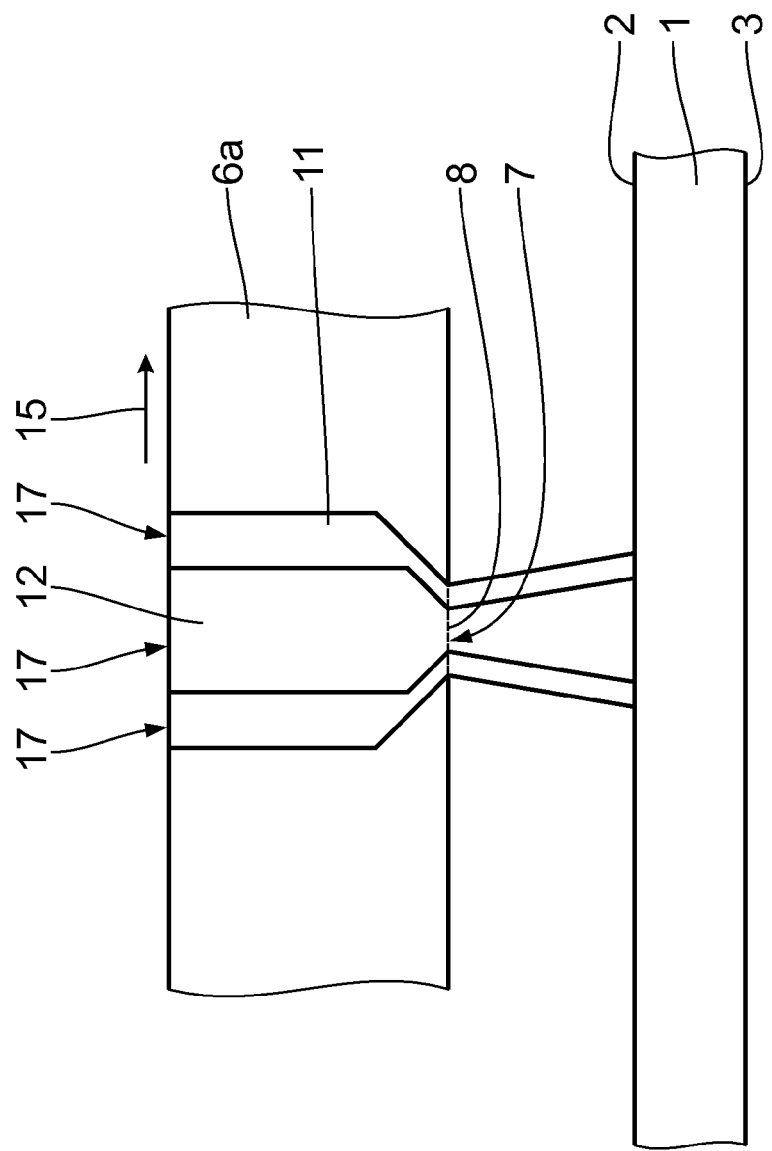
FIG. 2 shows a schematic representation of a second embodiment of the invention.
Figure 3:
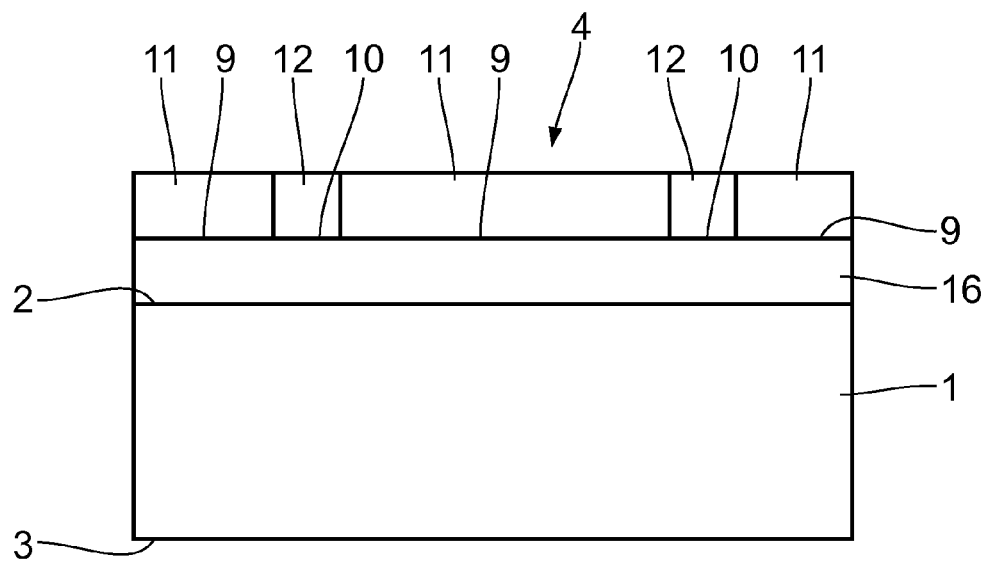
FIG. 3 shows a cross-section through a semiconductor substrate furnished with a mask according to the invention.
Figure 4:
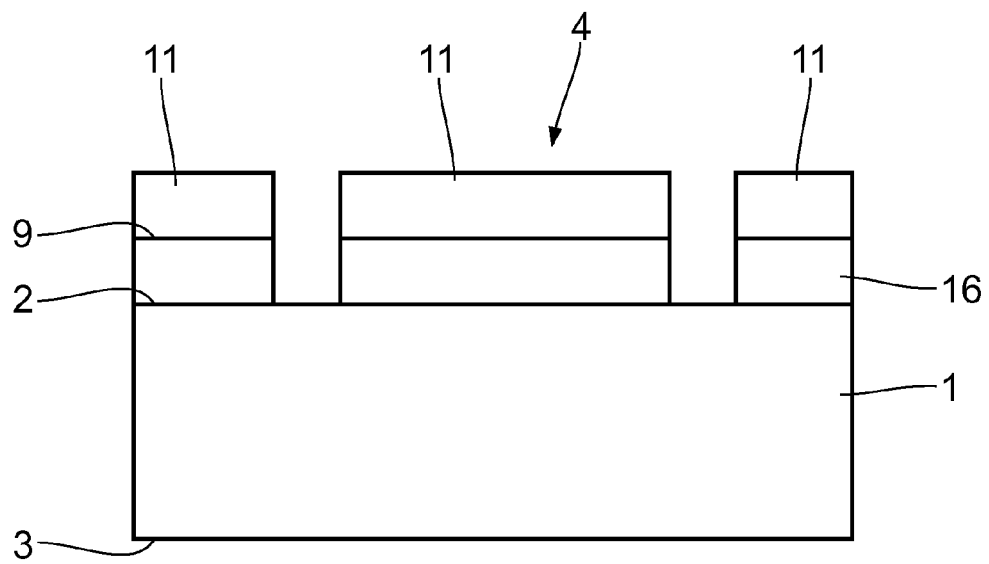
FIG. 4 shows a representation of the semiconductor substrate according to FIG. 3 after the opening of the passivation layer.

In the following, a first embodiment of the invention is described with reference to FIG. 1. First, a semiconductor substrate 1 is provided. The semiconductor substrate 1 is of a planar design. It exhibits a first side 2 and a second side 3 lying opposite thereto. Then, a mask 4 is applied to at least one of the sides 2, 3, an extrusion printing method being envisaged for the application of the mask 4.

A pressure device 5 envisaged therefor comprises a pressure head 6. The pressure head 6 exhibits a multitude of nozzles 7. The nozzles 7 are preferably aligned in parallel to each other. The nozzles 7 arranged in a linear arrangement along an arrangement direction 15 in the pressure head 6. They can exhibit different diameters. The nozzles 7 preferably exhibit a tapered shape. They each have a nozzle opening 8 with a diameter D. The diameter D lies in the range of 1 µm to 1 cm. It is preferably less than 1 mm, especially a maximum of 100 µm, especially a maximum of 20 µm. The nozzle opening 8 preferably exhibits a quadrangular, especially a rectangular, preferably a square cross-section. This facilitates an even application of the masking. The nozzles 7 serve the extrusion of mask materials. During application to the semiconductor substrate 1, the mask materials have a viscosity of at least 1 Pa·s, especially at least 10 Pa·s, preferably at least 30 Pa·s.

The mask 4 exhibits at least two adjacent areas 9, 10 with different mask materials. The two adjacent areas 9, 10 are to be understood as laterally adjoining areas 9, 10 on one of the sides 2, 3. In other words, the areas 9, 10 lie side by side on one of the sides 2, 3. The different mask materials exhibit a mixability that is at best negligible. The mask materials are, on the one hand, a masking material 11, on the other hand a sacrificial material 12. An organic material, especially a resin, preferably an epoxy resin, for example epichlorohydrin or bisphenol A or polymethylmethacrylate (PMMA) is envisaged as a masking material 11. A wax, especially a hot-melt wax, can also be envisaged as a masking material 11. The masking material 11 is resistant to etching solutions, which are envisaged for the further processing of the semiconductor substrate. The masking material 11 is especially etch-resistant to hydrofluoric acid and/or fluoride-containing pastes and/or galvanic electrolytes. The masking material solidifies during heating to a process temperature $T_P$. The process temperature $T_P$ lies in the range of 50° C. to 500° C. The sacrificial material 12 preferably comprises a mixture of solvents and/or varnish raw materials and/or cellulose derivatives. The sacrificial material 12 evaporates during heating to the process temperature $T_P$. The mask materials are applied to the semiconductor substrate 1 at the same time. During this, the sacrificial material 12 prevents the masking material 11 from running apart. Especially a co-extrusion printing method is envisaged for applying the mask materials.

The masking material 11 and the sacrificial material 12 are transferred by means of supply lines 13 from storage tanks 14 of the pressure device 5 to the respective nozzles 7.

The nozzles 7 for the sacrificial material 12 preferably exhibit a smaller diameter D than the nozzles 7 for the masking material 11. The diameter D of the nozzles 7 for the sacrificial material 12 is especially no more than half that of the diameter D of the nozzles 7 for the masking material 11.

The mask 4 is applied to the semiconductor substrate 1 in tracks. To this end, the pressure head 6 and the semiconductor substrate 1 are displaced relative to each other. The displacement preferably occurs vertically to the arrangement direction 15 of the nozzles 7.

To apply the mask 4, the pressure head 6 is preferably guided over the semiconductor substrate 1. The semiconductor substrate 1 can thus be arranged stationary. This is especially advantageous for a high-precision application of the mask 4. In principle, it is, however, also possible to guide the semiconductor substrate 1 past a stationary pressure head 6. For this, a conveyor belt not shown in the figure can, for example, be envisaged. An arrangement of said kind is especially advantageous if a multitude of semiconductor substrates 1 are to be furnished with relatively easy, especially straight-lined structures.

After the application of the mask 4, the semiconductor substrate 1 with the mask 4 is heated to the process temperature $T_P$. This leads to the solidification of the masking material 11 and/or to the evaporation of the sacrificial material 12.

After the evaporation of the sacrificial layer, the mask 4 can be used as an etching mask for wet-chemical and/or plasma etching. During this, only the second areas 10 on the semiconductor substrate 1, to which the sacrificial material 12 was originally applied, are etched while the first areas 9, which are covered by the masking material 11, are protected and are thus not etched. The mask 4 can especially be used for etching holes through a semiconductor substrate. Hence, with the aid of the mask 4, holes for so-called Emitter Wrap Through (EWT) solar cells can be made. To manufacture a contact structure for a semiconductor component, an electrically conductive metallisation is applied to the second areas 10, to which the sacrificial material 12 was originally applied. Especially a galvanic method is envisaged for applying the metallisation. During this, the mask 4 defines flanks of the galvanised metallisation and prevents a widening of the growing metallisation. Accordingly, it is envisaged for the mask 4 to exhibit, in the direction vertical to the surface of the semiconductor substrate 1, a thickness that is at least as great as the thickness of the contact structure to be applied. The details of the application of the metallisation result from DE 10 2007 038 744, reference to which is hereby made.

In an alternative embodiment, the mask 4 serves as a doping mask. In a subsequent ion implantation step, the semiconductor substrate 1 surface furnished with the mask 4 is, after evaporation of the sacrificial material 12, exposed to an ion beam of dopants, especially boron and/or aluminium for p-type doping or phosphorus for n-type doping. The masking material 11 absorbs the impinging ion beam, so that the doping only occurs in the second areas 10 to which the sacrificial material 12 had originally been applied. In a preferred variant of this embodiment, the masking material 11 absorbs the dopant beam only partially, so that a higher doping results in the second areas 10 than in the first areas 9, which are covered by the masking material 11. Using this method, selective emitters for solar cells can be manufactured.

In a further embodiment, the mask 4 itself serves to selectively etch a layer lying underneath, especially a passivation layer 16, on the semiconductor substrate 1. The layer to be etched can especially be a silicon dioxide or silicon nitride layer. Instead of the sacrificial material 12, an etching paste is applied in the first areas 9 on the semiconductor substrate 1, at which the layer to be etched is to be opened, for etching the layer. During the subsequent heating step, during which the semiconductor substrate 1 with the mask 4 is heated to the process temperature $T_P$, the etching paste selectively etches the layer lying underneath. In a subsequent watering step the etching paste is washed out. According to the invention, the watering step is performed in a weakly alkaline solution. This method is especially applied during the manufacture of local rear contacts for solar cells. After the opening of the passivation layer 16 on the rear side of the solar cell, the masking material 11 of the mask 4 is also removed. Thereafter, a metal contact is vapour-deposited across the whole surface. The metal contact creates a selective contact with the semiconductor substrate 1 in the first areas 9.

After the application of the mask 4, the semiconductor substrate 1 and the mask 4 together form an intermediate product during the manufacture of a semiconductor component.

In an alternative embodiment, a co-extrusion printing method is used for applying the mask 4. Here, the masking material 11 and the sacrificial material 12 are extruded through a common nozzle 7 in the pressure head 6a. For the supply of the different mask materials to the nozzle 7, the pressure head 6a exhibits internally at least two, especially at least three channels 17 arranged next to each other. The channels 17 are preferably separated from each another. Several, especially all channels 17 feed into a common nozzle 7. With this embodiment, several nozzles 7 can, of course, also be envisaged. The channels 17 are preferably arranged according to the nozzles 7 in the preceding embodiment in the arrangement direction 15 next to each other. The nozzle opening 8 preferably exhibits a quadrangular, especially a rectangular, preferably a square cross-section. This facilitates an even application of the masking.

The channel 17 for the sacrificial material 12 is flanked in the arrangement direction 15 on both sides by channels 17 for the masking material 11. Apart from the alternative design of the pressure head 6a, this embodiment corresponds to the ones described above, reference to the description of which is hereby made.

What is claimed is:
1. A method for masking a semiconductor substrate, the method comprising the following steps:
providing a planar semiconductor substrate having a first side and a second side lying opposite thereto; and
applying a mask to at least one of the first side and the second side, wherein an extrusion printing method is used for applying the mask, said mask comprising at least two adjacent areas with different mask materials, wherein an etching paste is used as one of said different mask materials for etching a layer on the semiconductor substrate.

2. A method for masking a semiconductor substrate, the method comprising the following steps:
provide a planar semiconductor substrate having a first side and a second side lying opposite thereto; and
applying a mask to at least one of the first side and the second side, wherein an extrusion printing method is used for applying the mask, said mask comprising at least two adjacent areas with different mask materials, wherein a doping step is used after the application of the mask, one of said different mask materials at least partly absorbing a dopant beam.

3. A method for masking a semiconductor substrate, the method comprising the following steps:
providing a planar semiconductor substrate having a first side and a second side lying opposite thereto; and
applying a mask to at least one of the first side and the second side, wherein an extrusion printing method is used for applying the mask, said mask comprising at least two adjacent areas with different mask materials, wherein an ion implantation step is used after the application of the mask, wherein first mask materials at least partly absorb a dopant beam.

* * * * *